(12) United States Patent
Chu et al.

(10) Patent No.: US 8,759,128 B2
(45) Date of Patent: Jun. 24, 2014

(54) LIGHT EMITTING DIODE (LED) DIE HAVING RECESSED ELECTRODE AND LIGHT EXTRACTION STRUCTURES AND METHOD OF FABRICATION

(75) Inventors: Jiunn-Yi Chu, Hsinchu County (TW); Trung Tri Doan, Baoshan Hsinchu (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 0 days.

(21) Appl. No.: 13/426,705

(22) Filed: Mar. 22, 2012

(65) Prior Publication Data

US 2013/0248816 A1 Sep. 26, 2013

(51) Int. Cl.
| | |
|---|---|
| H01L 33/00 | (2010.01) |
| H01L 21/461 | (2006.01) |
| H01L 21/44 | (2006.01) |
| H01L 33/38 | (2010.01) |

(52) U.S. Cl.
CPC ............ *H01L 21/461* (2013.01); *H01L 21/44* (2013.01); *H01L 33/382* (2013.01)
USPC ................ 438/29; 257/E33.065; 257/99

(58) Field of Classification Search
CPC .................................................. H01L 33/332
USPC ............................................................ 257/98
See application file for complete search history.

(56) References Cited

U.S. PATENT DOCUMENTS

| | | | |
|---|---|---|---|
| 7,186,580 B2 | 3/2007 | Tran et al. | |
| 7,413,918 B2 * | 8/2008 | Tran et al. | 438/46 |
| 7,432,119 B2 | 10/2008 | Doan | |
| 7,473,936 B2 | 1/2009 | Tran et al. | |
| 7,524,686 B2 | 4/2009 | Chu et al. | |
| 7,563,625 B2 | 7/2009 | Tran et al. | |
| 7,615,789 B2 | 11/2009 | Tran | |
| 7,897,420 B2 | 3/2011 | Chu et al. | |
| 8,008,678 B2 | 8/2011 | Tran et al. | |
| 2001/0054763 A1* | 12/2001 | Nido et al. | 257/745 |
| 2007/0257269 A1* | 11/2007 | Cho et al. | 257/95 |
| 2009/0218590 A1* | 9/2009 | Cai et al. | 257/99 |
| 2009/0267105 A1* | 10/2009 | Yu et al. | 257/99 |
| 2013/0240924 A1* | 9/2013 | Ni et al. | 257/98 |

FOREIGN PATENT DOCUMENTS

DE  102007057672  *  4/2009  .............. H01L 33/00

OTHER PUBLICATIONS

Machine translation of Fischer from ESPACENET.*

* cited by examiner

*Primary Examiner* — Eva Yan Montalvo
*Assistant Examiner* — Christopher Johnson
(74) *Attorney, Agent, or Firm* — Stephen A. Gratton

(57) ABSTRACT

A light emitting diode (LED) die includes a semiconductor substrate having an n-type confinement layer, a multiple quantum well (MQW) layer in electrical contact with the n-type confinement layer configured to emit electromagnetic radiation, a p-type confinement layer in electrical contact with the multiple quantum well (MQW) layer; multiple light extraction structures on the n-type confinement layer configured to scatter the electromagnetic radiation; and an electrode in a recess embedded in the n-type confinement layer proximate to the light extraction structures. A method of fabrication includes: forming the semiconductor substrate; forming a recess in the n-type confinement layer having sidewalls and a planar bottom surface; forming an electrode in the recess comprising a conductive material conforming to the sidewalls and to the bottom surface of the recess; planarizing the electrode; and forming a plurality of light extraction structures in the n-type confinement layer proximate to the electrode.

4 Claims, 5 Drawing Sheets

LIGHT EMITTING DIODE (LED) DIE HAVING RECESSED ELECTRODE AND LIGHT EXTRACTION STRUCTURES AND METHOD OF FABRICATION

BACKGROUND

This disclosure relates generally to optoelectronic devices and more particularly to a light emitting diode (LED) die, and to a method for fabricating the light emitting diode (LED) die.

A light emitting diode (LED) die can include a multi layer semiconductor substrate made of a compound semiconductor material, such as GaN. For example, the semiconductor substrate can include a p-type confinement layer having p-type dopants, an n-type confinement layer having n-type dopants, and a multiple quantum well (MQW) layer located between the confinement layers configured to emit electromagnetic radiation. A light emitting diode (LED) die also includes an n-electrode and a p-electrode for making external connections to the outside world. With a vertical light emitting diode (VLED), the semiconductor substrate is located between the n-electrode and the p-electrode, which are vertically separated. With a horizontal light emitting diode (LED) die, the n-electrode and the p-electrode are still separated on the semiconductor substrate but are generally planar to one another.

With either type of die, at least one of the electrodes can block and absorb electromagnetic emission from the multiple quantum well (MQW) layer, thus decreasing electroluminescence intensity. For example, with a vertical light emitting diode (VLED) die, the n-electrode can be located on the n-type confinement layer directly in the path of electromagnetic radiation emitted by the multiple quantum well (MQW) layer. Because of this absorption, it is necessary to make the surface of the n-electrode as small as possible. However, the structure and the morphology of the vertical light emitting diode (VLED) die can make the n-electrode larger. For example, one type of vertical light emitting diode (VLED) die includes light extraction structures, such as roughened elements on the n-type confinement layer.

The n-electrode, which is formed in close proximity to these roughened extraction structures, can also have an increased surface area which blocks emission and lessens the benefit of the extraction structures. This situation is illustrated in FIG. 1. A prior art vertical light emitting diode (VLED) die 10 includes an n-type confinement layer 12 in electrical contact with an n-electrode 14, a multiple quantum well (MQW) layer 16 configured to emit electromagnetic radiation, and a P-type confinement layer/reflector 18 in electrical contact with a p-electrode 20. In addition, the n-type confinement layer 12 includes light extraction structures 24 in the form of multi faceted elements that provide light scattering. However, as indicated by the circled area 22 in FIG. 1, the n-electrode 14 has an increased surface area due to deposition of metal on the light extraction structures 24.

Another problem is that during fabrication of the n-electrode 14, a loading effect can occur, which decreases the roughness of the extraction structures 24 and their effectiveness. For example, as shown in FIG. 2, during the fabrication process for the vertical light emitting diode (VLED) die 10, a mask 26 can be used to protect the area where the metal for the n-electrode 14 (FIG. 1) will be deposited. However, as indicated by the circled area 28 in FIG. 2, the mask 26 can have a loading effect in which the roughness of the light extraction structures 24 decreases along the edges of the mask 26. Further, due to limitations in photolithography tolerances, it is difficult to form the electrodes 14 without adversely affecting the light extraction structures 24.

One proposed solution for these problems would be to form the n-electrode 14 directly on the light extraction structures 24. However, direct deposition on the light extraction structures 24 can form the n-electrode 14 with a rough surface, which is known to cause higher electrical resistivities in deposited electrodes and conductors. In addition, the roughed surface of the n-electrode 14 can cause a high contact resistance to outside electrical connections (e.g., wire bonds). Higher contact resistances between the n-electrode 14 and the n-type confinement layer 12 can also occur due to a low dopant level in the n-type confinement layer 12. However, a low dopant level is required to reduce film defects in a MOCVD process for forming the n-electrode 14.

The present disclosure is directed to a light emitting diode (LED) die having light extractions structures and at least one electrode with a small surface area for minimizing absorption of electromagnetic radiation, but with a high electrical conductivity, a low contact resistance and a planar morphology. Also provided are a method for fabricating the light emitting diode (LED) die and a light emitting diode (LED) system incorporating the die.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 3:
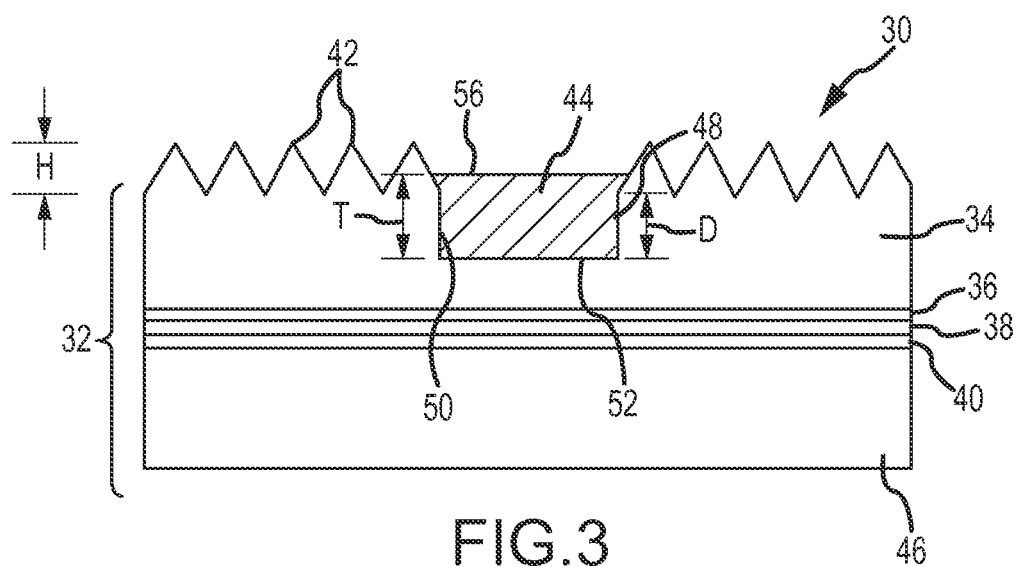
FIG. 3 is a schematic cross sectional view of a light emitting diode (LED) die having a recessed electrode and light extraction structures.

Referring to FIG. 3, a light emitting diode (LED) die 30 is illustrated. The light emitting diode (LED) die 30 is in the form of a vertical light emitting diode (VLED). For simplicity various elements of the light emitting diode (LED) die 30 are not illustrated. However, this type of vertical light emitting diode (VLED) die is further described in U.S. Pat. No. 7,615, 789, which is incorporated herein by reference. Although the light emitting diode (LED) die 30 is described as a vertical light emitting diode (VLED), it is to be understood that the concepts described herein can also be applied to other types of light emitting diode (LED) dice such as ones with planar electrode configurations.

The light emitting diode (LED) die 30 includes a multi-layer semiconductor substrate 32 in the form of an epitaxial stack having an n-type confinement layer 34, a multiple quantum well (MQW) layer 36 in electrical contact with the n-type confinement layer 34 configured to emit electromagnetic radiation, a p-type confinement layer 38 in electrical contact with the multiple quantum well (MQW) layer 36, and a reflector layer 40.

The n-type confinement layer 34 preferably comprises n-GaN. Other suitable materials for the n-type confinement layer 34 include n-AlGaN, n-InGaN, n-AlInGaN, AlInN and n-AlN. The multiple quantum well (MQW) layer 36 preferably includes one or more quantum wells comprising one or more layers of InGaN/GaN, AlGaInN, AlGaN, AlInN and AlN. The p-type confinement layer 38 preferably comprises p-GaN. Other suitable materials for the p-type confinement layer 38 include p-AlGaN, p-InGaN, p-AlInGaN, p-AlInN and p-AlN.

As shown in FIG. 3, the light emitting diode (LED) die 30 also includes a plurality of light extraction structures 42 on the n-type confinement layer 34. U.S. Pat. Nos. 7,186,580 B2; 7,413,918 B2; 7,432,119 B2; 7,524,686 B2; 7,563,625 B2; 7,897,420 B2 and 8,008,678 B2, all of which are incorporated herein by reference, disclose vertical light emitting diode (VLED) dice having extraction structures, and methods of fabrication. For example, the light extraction structures 42 can comprise a roughened surface of the n-type confinement layer 34 comprised of a plurality of random peaks and valleys.

Still referring to FIG. 3, the light emitting diode (LED) die 30 also includes a recessed n-electrode 44 embedded in the n-type confinement layer 34 proximate to the light extraction structures 42, and a p-electrode 46. The n-electrode 44 and the p-electrode 46 can comprise a conductive material, such as a single layer of a metal such as W, Ti, Mo, Al, Cu, Ni, Ag, Au or Co, a metal alloy such as Cu—Co or Cu—Mo, or a metal stack such as Ni/Cu or Ni/Cu—Mo. In addition, the p-electrode 46 can have a larger surface area than the n-electrode 44, which substantially covers the side of the light emitting diode (LED) die 30.

Figure 1:
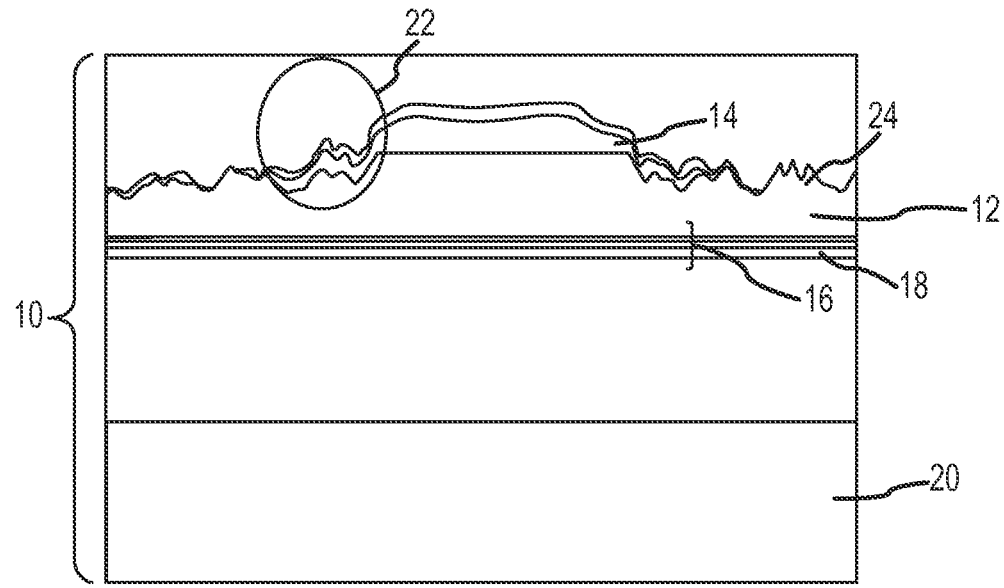
FIG. 1 is a schematic cross sectional view of a prior art vertical light emitting diode (VLED) die.
Figure 2:
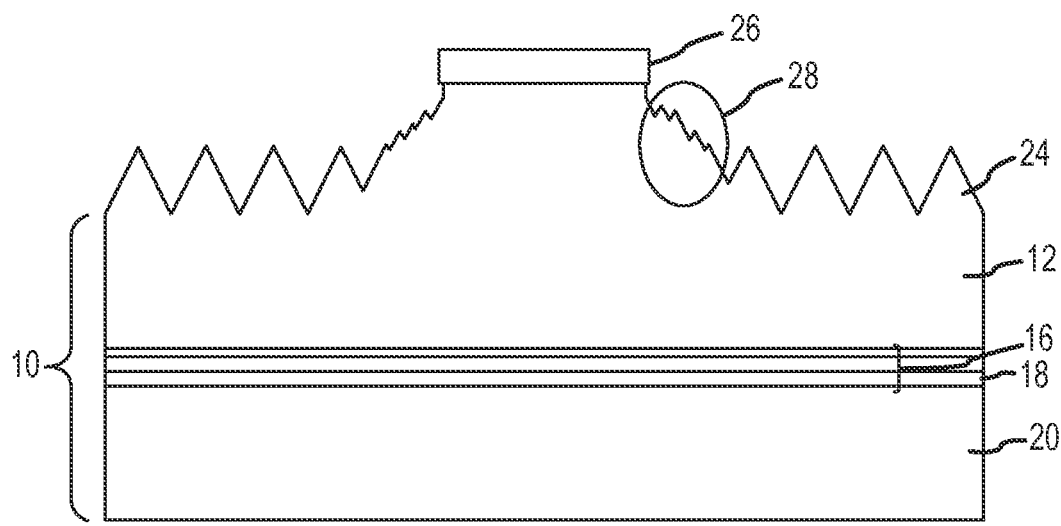
FIG. 2 is a schematic cross sectional view of a prior art fabrication process for the vertical light emitting diode (VLED) die.
Figure 4:
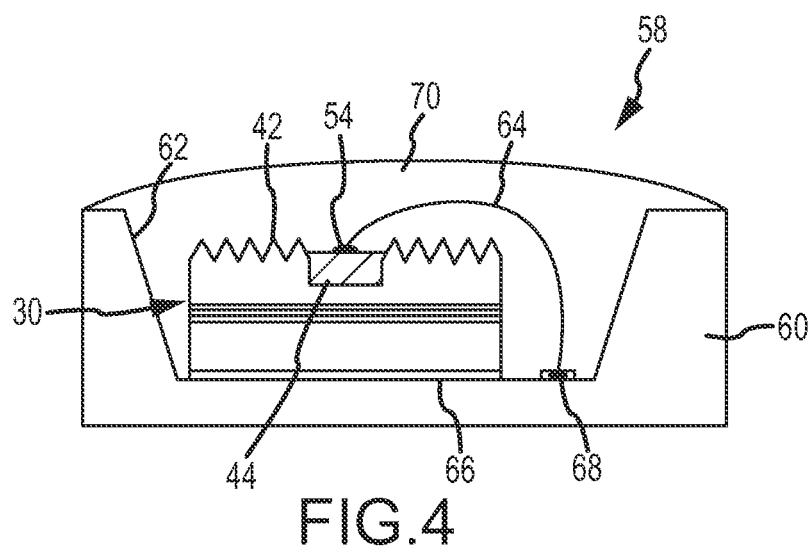
FIG. 4 is a schematic cross sectional view of a light emitting diode (LED) system incorporating the light emitting diode (LED) die.

The n-electrode 44 differs from prior art electrodes 14 (FIG. 1) on the light emitting diode (LED) die 10 (FIG. 1), as it is formed in a recess 48 in the n-type confinement layer 34. The recess 48 includes sidewalls 50. In addition, the metal that forms the n-electrode 44 conforms to the sidewalls 50, which provide a large surface area for electrical contact with the n-type confinement layer 34 and a low contact resistance $RC_{NP}$ between the n-electrode 44 and the n-type confinement layer 34. In addition, the n-electrode 44 has a smooth planar surface 56 because the bottom surface 52 of the recess 48 can also be smooth and planar, which provides low contact resistance $RC_O$ with the outside world, such as a wire bond 54 (FIG. 4). Further, the n-electrode 44 is embedded in the n-type confinement layer 34 but is not deposited on the roughened light extraction structures 42, which would also make the n-electrode 44 rough. In the illustrative embodiment the n-electrode has a polygonal peripheral shape (e.g., square, rectangular) but can also be made with another peripheral shape (e.g., round, oval). In addition, the recess 48 has a generally polygonal configuration but can also be rounded or hemispherical in shape. In addition, the depth D of the recess 48, the thickness T of the n-electrode 44 and the height H of the light extraction structures 42 can be selected such that the surface 56 of the n-electrode 44 is also recessed with respect to the peaks of the light extraction structures 42. Alternately, as shown in FIG. 5D, the peaks of the light extraction structures 42 can be generally planar to the surface 56 of the n-electrode 44. Still further, the dimensions of the recess 48 can be selected such that the n-electrode 44 has a small surface area, which is not affected by the morphology of the light extraction structures 42 and the n-type confinement layer 34.

Referring to FIG. 4, a light emitting diode (LED) system 58 includes a substrate 60, the light emitting diode (LED) die 30 mounted to the substrate 60, and an electrically insulating, light transmissive passivation layer 70 which encapsulates the light emitting diode (LED) die 30. For illustrative purposes, the light emitting diode (LED) system 58 is shown with only one light emitting diode (LED) die 30 mounted to the substrate 60. However, in actual practice the light emitting diode (LED) system 58 can include a plurality of light emitting diode (LED) dice 30 mounted to the substrate 60, and arranged in a desired array to form an optoelectronic device, such as an LED display. The substrate 60 can comprise a semiconductor material, such as silicon (Si), or another material, such as GaAs, SiC, AlN, $Al_2O_3$, or sapphire. The substrate 60 includes a cavity 62 wherein the light emitting diode (LED) die 30 is mounted. An electrically conductive die attach layer 66 attaches the light emitting diode (LED) die 30 to the substrate 60. In addition, a wire-bonded wire 64 electrically connects the n-electrode 44 to an electrode 68 on the substrate 60.

Figure 5A:
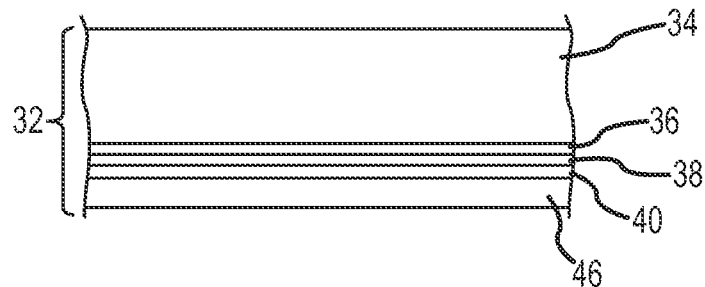
FIGS. 5A-5D are schematic cross sectional views illustrating steps in a method for fabricating the light emitting diode (LED) die.
Figure 5B:
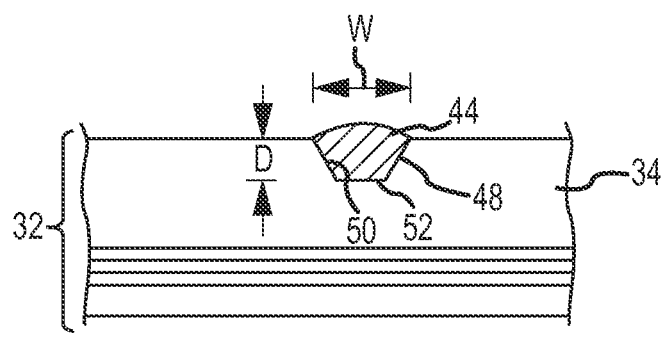
Figure 5C:
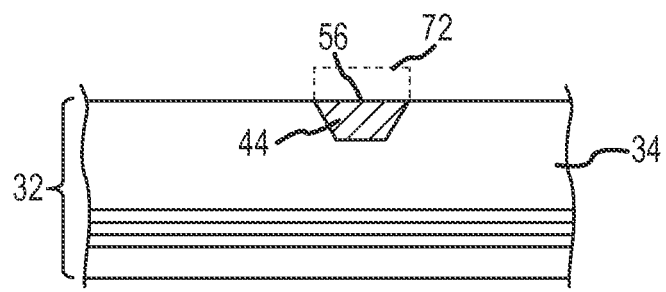
Figure 5D:
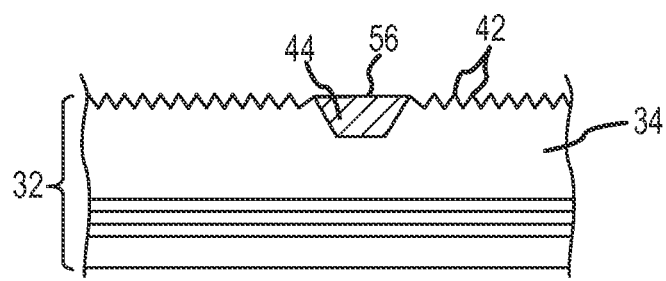

Referring to FIGS. 5A-5D, steps in a method for fabricating the light emitting diode (LED) die 30 are illustrated. Preferably this method is performed at the wafer level using a wafer, which is then singulated into individual dice. Initially, as shown in FIG. 5A, the semiconductor substrate 32 can be formed on a carrier (not shown) using a suitable deposition process, such as vapor phase epitaxy (VPE), molecular beam epitaxy (MBE) or liquid phase epitaxy (LPE). The semiconductor substrate 32 includes the n-type confinement layer 34, the multiple quantum well (MQW) layer 36, the p-type confinement layer 38 and the reflector layer 40. These elements can be formed using methods known in the art, such as those disclosed in the previously cited US patents.

Next as shown in FIG. 5B, a recess forming step can be performed to form the recess 48 in the n-type confinement layer 34. Although only one recess 48 is illustrated, it is understood that using a wafer level process a plurality of recesses can be formed. One suitable process for forming the recess comprises etching (e.g., wet, dry, RIE) through a mask. Depending on the shape of the recess 48, other suitable processes include laser cutting, saw cutting, diamond cutting, and water jetting. After the recess forming step, the substrate 32 can be cleaned in a liquid or a solvent to remove the etch mask, or other protective coating. The dimensions of the recess 48 such as the width W and the depth D can be selected as required but preferably to make the n-electrode with as small of a surface area as is necessary. In addition, the sidewalls 50 can be sloped as is consistent with an etch process, and the bottom surface 52 can be smooth and planar.

As also shown in FIG. 5B, an electrode forming step can be performed. During this step, a single layer of metal or layers of metal can be deposited in the recess to form the n-electrode 44 using a suitable deposition process. Suitable deposition processes include electro-deposition, electroless-deposition, chemical vapor deposition (CVD), plasma enhanced chemical vapor deposition (PECVD), physical vapor deposition (PVD), evaporation, lift-off, and plasma spray. The n-electrode 44 can comprise a single layer of a metal such as W, Ti, Mo, Al, Cu, Ni, Ag, Au or Co, a metal alloy such as Cu—Co or Cu—Mo, or a metal stack such as Ni/Cu or Ni/Cu—Mo.

Next as shown in FIG. 5C, a planarizing step can be performed using a suitable process can be used to planarize the n-electrode 44. Suitable processes include polishing, chemical mechanical planarization (CMP) and etching. As also shown in FIG. 5C, a mask 72 can optionally be formed on the n-electrode 44 for protection during subsequent forming of the light extraction structures 42.

Next as shown in FIG. 5D, a light extraction structures forming step can be performed to form the light extraction structures 42. This step can be performed substantially as disclosed in the previously cited US patents. Suitable processes for forming the light extraction structures include wet etching, photoenhanced wet etching, dry etching, or photoelectrochemical (PEC) oxidation and etching. Alternately, polystyrene spheres can be attached to the n-type confinement layer 34 using a suitable process substantially as disclosed in the previously cited US patents.

Figure 6A:
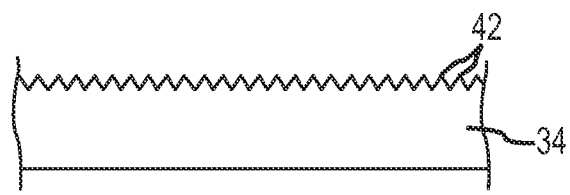
FIGS. 6A-6D are schematic cross sectional views illustrating steps in an alternate method for fabricating the light emitting diode (LED) die.

Referring to FIGS. 6A-6D, steps in an alternate method for fabricating the light emitting diode (LED) die 30 are illustrated. Preferably this method is also performed at the wafer level using a wafer, which is then singulated into individual dice. Initially, the semiconductor substrate 32 can be formed with the n-type confinement layer 34, the multiple quantum well (MQW) layer 36, the p-type confinement layer 38 and the reflector layer 40, as previously described. For simplicity only the n-type confinement layer 34 is illustrated in FIGS. 6A-6D. As shown in FIG. 6A, a light extraction structures forming step can be performed to form the light extraction structures 42, substantially as previously described and illustrated in FIG. 5D.

Figure 6B:
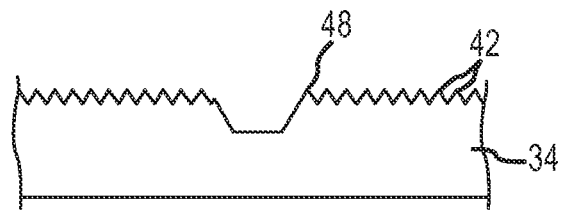

Next, as shown in FIG. 6B, a recess forming step can be performed to form the recess 48 in the n-type confinement layer 34 having the light extraction structures 42. This step can be performed substantially as previously described and shown in FIG. 5B.

Figure 6C:
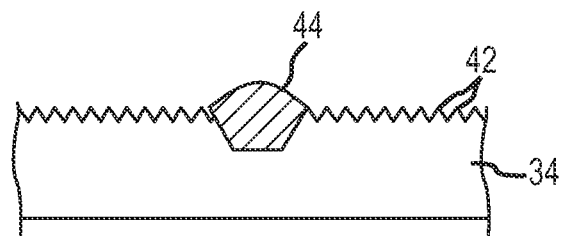

Next, as shown in FIG. 6C, an electrode forming step can be performed in which a metal or layers of metal can be deposited in the recess to form the n-electrode 44 using a suitable deposition process. This step can be performed substantially as previously described and shown in FIG. 5B. In addition, the n-electrode 44 can include multiple layers including one or more planarizing layers.

Figure 6D:
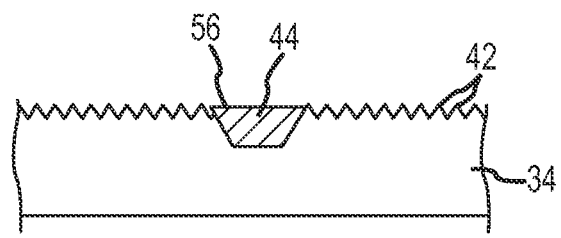

Next as shown in FIG. 6D, a planarizing step can be performed using a suitable process to planarize the n-electrode 44 and form the planar surface 56. This step can be performed substantially as previously described and shown in FIG. 5D.

Figure 7A:
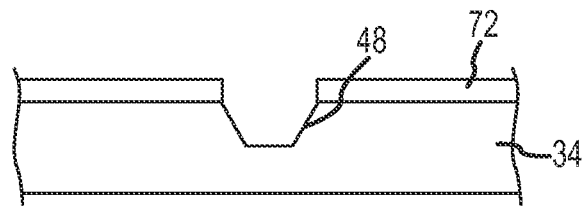
FIGS. 7A-7C are schematic cross sectional views illustrating steps in an alternate method for fabricating the light emitting diode (LED) die.
Figure 7B:
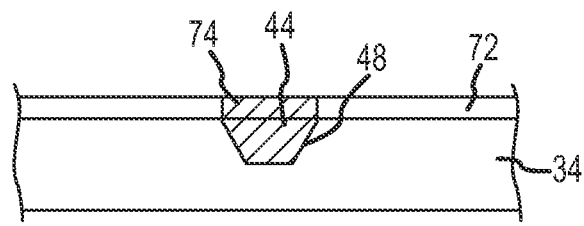
Figure 7C:
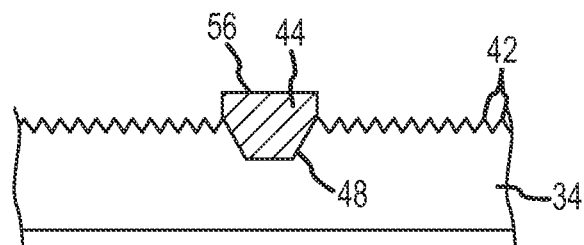

Referring to FIGS. 7A-7C, steps in an alternate method for fabricating the light emitting diode (LED) die 30 are illustrated. Preferably this method is also performed at the wafer level using a wafer, which is then singulated into individual dice. Initially, the semiconductor substrate 32 can be formed with the n-type confinement layer 34, the multiple quantum well (MQW) layer 36, the p-type confinement layer 38 and the reflector layer 40, as previously described. For simplicity only the n-type confinement layer 34 is illustrated in FIGS. 7A-7C. As shown in FIG. 7A, a recess forming step is performed using an etch/lift off mask 72 and an etching process substantially as previously described and shown in FIG. 5B.

Next, as shown in FIG. 7B, an electrode forming step can be performed using the etch/lift off mask 72 and an additive or "lift off" process to deposit metal in the recess 48. Optionally, an electro plating process can be employed to form an additional protective layer 74 which increased the thickness of the electrode 44 and also protects the electrode during subsequent processing.

Next as shown in FIG. 7C, a light extraction structures forming step can be performed to form the light extraction structures 42. This step can be performed substantially as previously described and shown in FIG. 5D.

Figure 8:
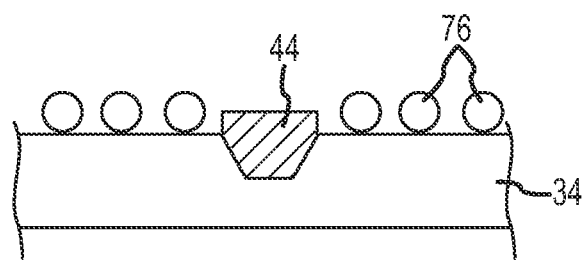
FIG. 8 is a schematic cross sectional view illustrating a step in an alternate method for fabricating the light emitting diode (LED) die.

Referring to FIG. 8, a step in an alternate method for fabricating the light emitting diode (LED) die 30 is illustrated. In this method the electrode 44 is formed using a suitable process such as the method previously described and shown in FIGS. 7A-7B. However, rather than roughening the surface of the n-type confinement layer 34 to form the light extraction structures 42 (FIG. 7C), light extraction structures 76 in the form of balls or other structures are deposited or adhesively bonded to the n-type confinement layer 34. The light extraction structures 76 can be formed as described in previously cited U.S. Pat. No. 7,413,918 B2.

Thus the disclosure describes an improved light emitting diode (LED) die and method of fabrication. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating a light emitting diode (LED) die comprising:
    forming a multi-layer semiconductor substrate comprising an n-type confinement layer, a multiple quantum well (MQW) layer in electrical contact with the n-type confinement layer configured to emit electromagnetic radiation, and a p-type confinement layer in electrical contact with the multiple quantum well (MQW) layer;
    forming a plurality of light extraction structures in the n-type confinement layer comprising a roughened surface;
    forming a recess in the n-type confinement layer proximate to the light extraction structures having sidewalls and a planar bottom surface;
    forming an electrode in the recess comprising a conductive material conforming to the sidewalls and to the bottom surface of the recess;
    planarizing the electrode to form a planar surface;
    wherein the planar surface of the electrode has a surface area corresponding to an area of the bottom surface of the recess with the area of the bottom surface selected such that the surface area is small enough to not be affected by the roughened surface; and
    mounting the die to a substrate of a light emitting diode (LED) system and wire bonding the planar surface of the electrode to a second electrode on the substrate.

2. The method of claim 1 wherein the roughened surface comprises a plurality of peaks having a height H, the recess has a depth D and the metal has a thickness T, with H, D and T selected such that the planar surface is recessed with respect to the peaks of the light extraction structures.

3. The method of claim 1 wherein the recess has a width W selected to provide the planar surface of the electrode with a surface area small enough to not be affected by the roughened surface.

4. The method of claim 1 wherein the planarizing the electrode step comprises a process selected from the group consisting of polishing, chemical mechanical planarization (CMP) and etching.

* * * * *